United States Patent [19]
Kreid

[11] 4,398,573
[45] Aug. 16, 1983

[54] APPARATUS FOR THE FORMING, SHAPING AND CUTTING OF CONTACT LEADS OF ELECTRONIC COMPONENTS

[76] Inventor: Ferdinand Kreid, Speicherstrasse 3, Karlsbad I, Fed. Rep. of Germany, 7516

[21] Appl. No.: 414,014

[22] Filed: Sep. 2, 1982

Related U.S. Application Data

[63] Continuation of Ser. No. 134,177, Mar. 26, 1980, abandoned.

[51] Int. Cl.³ .............................................. B21F 1/00
[52] U.S. Cl. ...................................... 140/105; 72/452
[58] Field of Search .................... 140/105; 72/315, 452

[56] References Cited
U.S. PATENT DOCUMENTS 3,812,703  5/1974  Tepper ................................ 140/105
4,072,177  2/1978  Daebler .............................. 140/105

Primary Examiner—Lowell A. Larson
Assistant Examiner—Linda McLaughlin
Attorney, Agent, or Firm—Klaus J. Bach

[57] ABSTRACT

In an apparatus for forming, shaping and cutting of contact leads of electronic components which has means for grasping and holding a component in a predetermined position while the working tools are moved to the component to perform their duties, all tools are slidably supported at opposite sides of said predetermined position and between axially spaced cam wheels which have cam surfaces with which the tools are in engagement and which move the tools into working positions upon rotation, thereby permitting the component to remain in a predetermined position such that large movement of large parts is not necessary and the working steps can overlap and therefore be performed rapidly.

5 Claims, 11 Drawing Figures

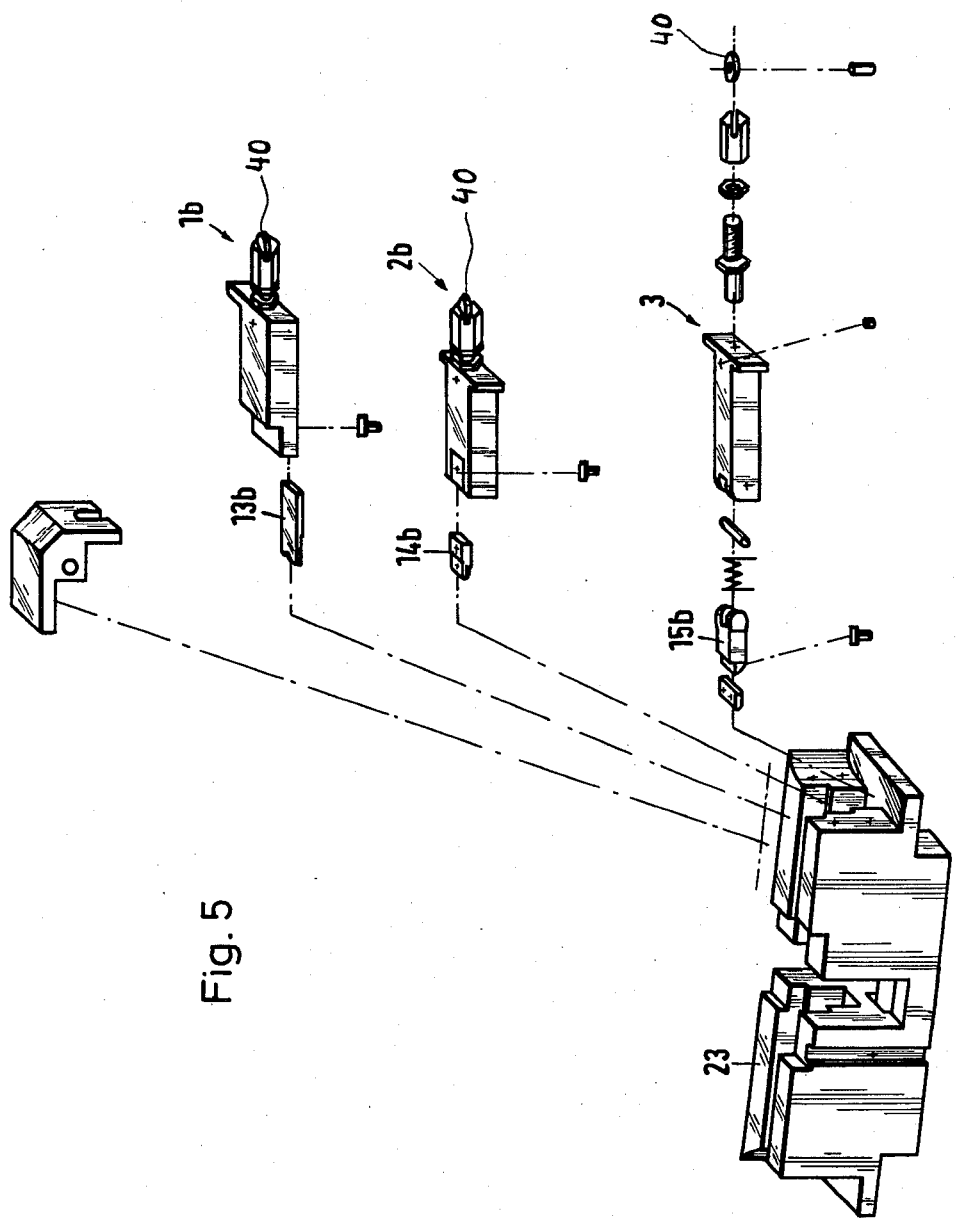

APPARATUS FOR THE FORMING, SHAPING AND CUTTING OF CONTACT LEADS OF ELECTRONIC COMPONENTS

This is a continuation of application Ser. No. 134,177, filed 03/26/1980 now abandoned.

BACKGROUND OF THE INVENTION

1. Field of the Invention

The present invention relates to an apparatus for forming, shaping and cutting the contact leads of electronic components which contact leads project from one end of such components. The components may be supplied either singly or they may be held in belts or in stamping strips. 2. Description of the Prior Art Apparatus for the forming, shaping and cutting of contact leads of electronic components usually include a turntable which has up to four complete tools mounted thereon. The components are advanced to the turntable at one particular location and are picked up by a tool arriving at the particular location. Work is then performed on the components in the respective tool after the turntable is rotated with the tool to a different working location. The various working steps are performed at different locations around the turntable and the component is moved with the tool from location to location. There are at least three working steps, the grasping of a component at its contact leads adjacent the component body, the bending and forming of the contact leads and the cutting of the contact leads, and the locations for performing these steps ought to be spaced so that the turntable has to be moved by a certain angle from working step to working step. The number of tools which can be mounted on a turntable is therefore limited; normally, the turntable cannot accept more than four tools. This, and the fact that the tools with the components must be moved from location to location, provides limits for the output of such a machine. Further, it is of course impossible for such a machine to handle components which are held in belts or stamping strips.

It is therefore desirable to provide such an apparatus which is capable of increased output and, further of handling also components supported on belts or stamping strips.

SUMMARY OF THE INVENTION

Apparatus for the forming, shaping and cutting of contact leads of electronic components, which contact leads extend from one end of the component. The apparatus has means for grasping the contact leads of a component and supporting the component centrally between opposite axially spaced cam wheels rotatably mounted on a support frame for synchronous operation. Tools are slidably disposed in the space between the cam wheels and associated with cam faces on the cam wheels to be operated thereby. The tools are biased by springs into engagement with the respective cam surfaces. Further, means are provided synchronous with the cam wheels for admitting the electronic components to and removing them from the supporting means between the cam wheels.

With this apparatus, the components together with some of the tools are not moved from machining location to machining location but the component is arranged in a fixed position and the machining tools are moved and cooperate to rapidly perform all required operations. The machining steps can be performed in short sequence. Movement initiation of one tool does not need to wait until a new machining location is reached and, furthermore, the tools can be arranged to cooperate for certain machining steps. Machining of the contact leads is greatly speeded up, as the cam wheels can rotate at constant speed and no stepwise movement of the component is required. There is only one apparatus, with one component holder—as compared to normally four on a turntable—and one drive mechanism with relatively simple shaping and cutting tools operated thereby. This not only significantly reduces the tooling costs but also results in equal treatment of the component leads since they are all handled by the same mechanism. Since, furthemore, the component holding structure is stationary during the whole working process it is possible to handle components mounted on belts or stamping strips which are introduced at one side and leave the apparatus at its other side. The component feeding means may include component operating equipment for feeding single components on a conveyor or handling equipment for passing belt-mounted or stamping strip-mounted components through the apparatus.

The handling equipment is preferably also operated by cams mounted on the same shaft as, or being part of, the cam wheels.

BRIEF DESCRIPTION OF THE DRAWINGS

In the drawings which show schematically some preferred embodiments of the invention:

FIG. 5 is an exploded view of a slide housing on the tools slidably supported therein.

DESCRIPTION OF THE PREFERRED EMBODIMENTS

Figure 1:
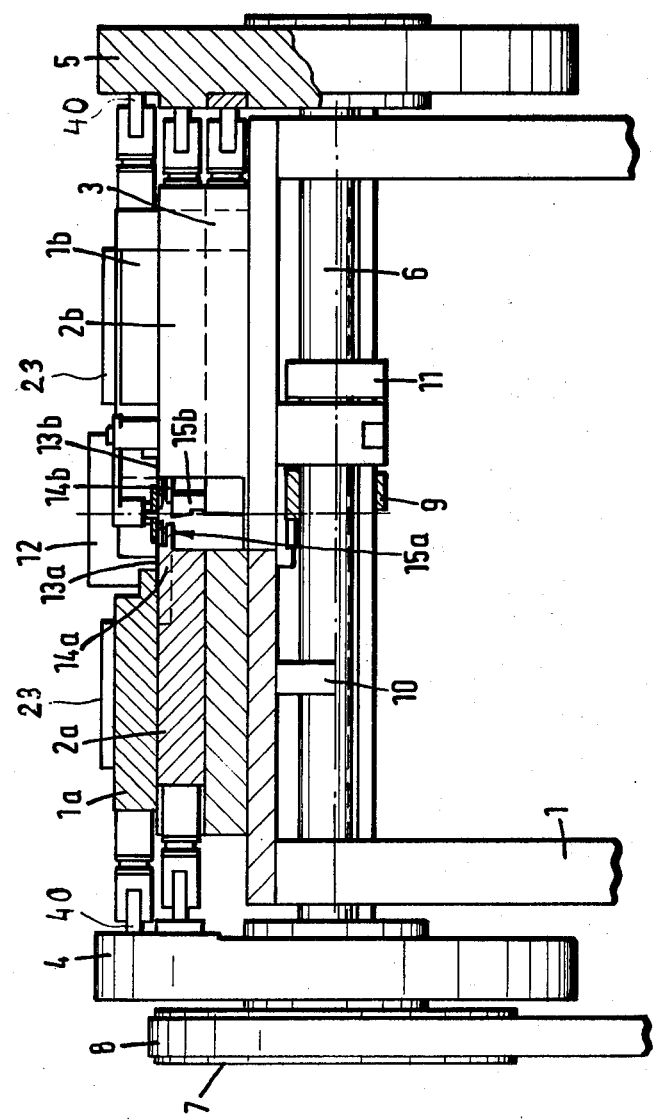
FIG. 1 is a front view of the apparatus partially in section.

As shown in FIG. 1 a machine frame 1 has two pairs of slide tools 1a, 1b and 2a, 2b and a single slide tool 3 slidably supported in a slide housing 23 (FIG. 5). These slide tools are disposed between cam wheels 4, 5 mounted on a shaft 6 in axially spaced relationship and are operable by the cam wheels 4, 5 toward which they are biased. The shaft 6 carries a sheave 7 driven by a V-belt 8. In addition to the cam wheels 4 and 5, the shaft 6 carries cams 9 and 10 which are utilized to drive a component feeding arrangement 12. At their ends adjacent the cam wheels 4 and 5 the slides 1a, 2a, 1b, 2b and 3 have rollers 40 which are in engagement with respective cam surfaces on the sides of the cam wheels 4 and 5. At their opposite ends the slides 1a, 1b, 2a, 2b and 3 carry cooperating tools 13a, 13b, 14a, 14b, 15a and 15b. The tool 13a, 13b consists of two clamping plates adapted to engage therebetween the contact leads 16 of an electronic component 17. During the following working, the contact leads remain always engaged by the single set of clamping plates 13a, 13b so that pulling or bending forces occurring during working do not reach the component body.

Figure 2A:
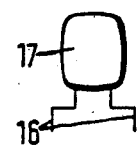
FIG. 2a shows a component with two contact leads already worked.

The tool pair 14a, 14b is a forming and shaping tool capable of bending the contact leads to a shape as given for example in FIG. 2a and the tool pair 15a and 15b finally forms a cutting tool for cutting the contact leads 16 to a predetermined length. The cutting tool 15a cooperating with the cutting tool 15b is actually the underside of the forming and shaping tool 14a.

Figure 4A:
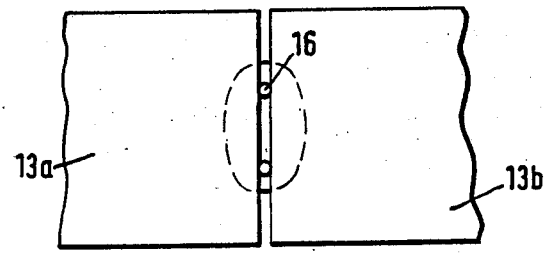
FIG. 4a shows a holding tool for a component with two contact leads.
Figure 4B:
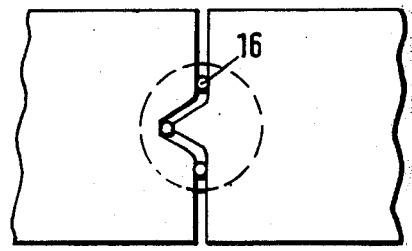
FIG. 4b shows a holding tool for a component with three contact leads.
Figure 6:
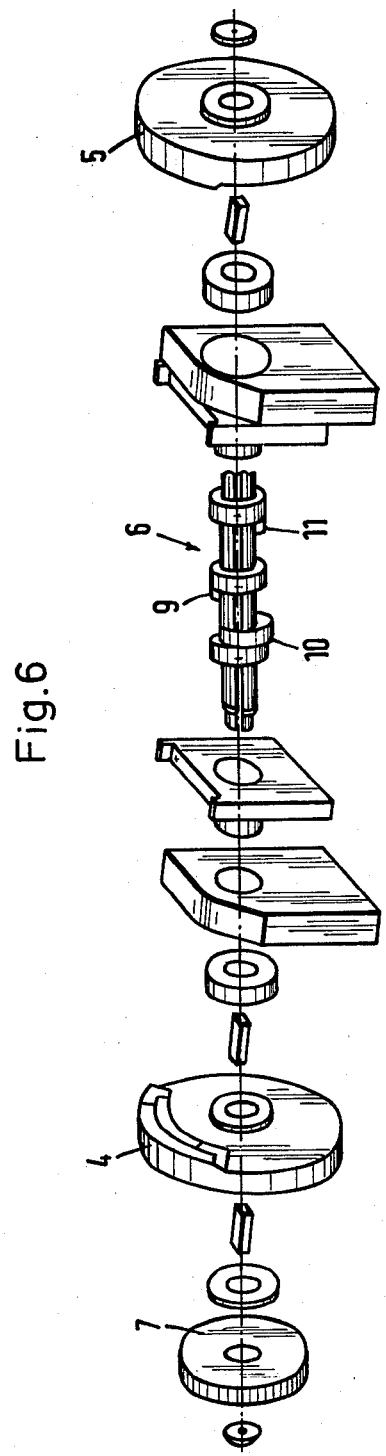
FIG. 6 is an exploded view of the cam wheel shaft and cam wheels.

FIG. 4b shows a clamping tool similar to that shown in FIG. 4a but provided with means for engaging three contact leads rather than the two as shown in FIG. 4a.

Figure 3A:
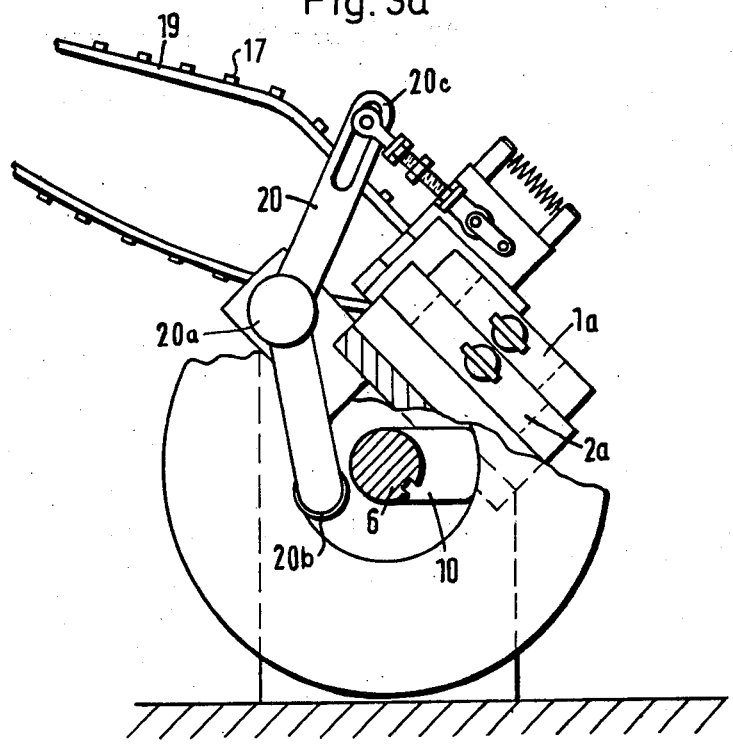
FIG. 3a is a side view of the apparatus of FIG. 1 and also showing a component-holding belt.

FIG. 3a shows a component feed apparatus 12 (FIG. 1) which consists of a feed belt 19 operated by the cam 10 of shaft 6 by means of a lever mechanism 20. The lever mechanism 20 is pivotally supported at 20a and has the end 20b of one arm arranged adjacent the cam 10 and its other end 20c linked to a belt gripping and moving mechanism which sequentially advances the belt 19 with the devices 17 thereon as it is operated by the cams 10 once with every turn of the shaft 6 for moving a new device 17 into position between the clamping plates 13a and 13b.

Figure 3B:
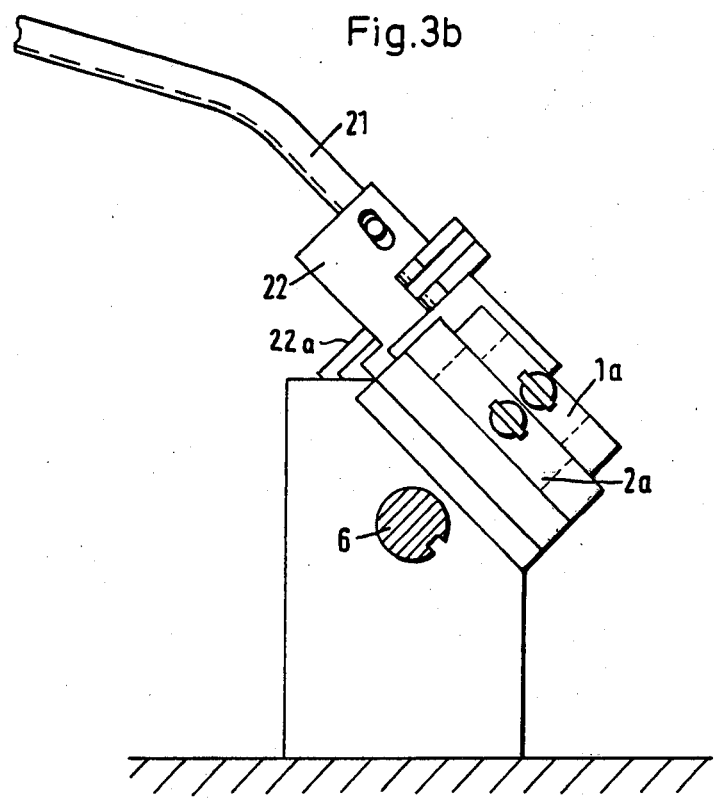
FIG. 3b is a side view of the apparatus of FIG. 1 with a component admitting trough.

FIG. 3b shows another component feed mechanism which includes a feed trough 21 through which the components are supplied and a separating mechanism 22 operated by cam 11 (FIG. 1) which separates the components for processing in the forming, shaping and cutting apparatus. The feed trough 21 is steep enough such that the components slide through the trough 21 by gravity forces. In the separating mechanism 22 they are stopped however by pins associated with a lever mechanism 22a which is operated by cam 11 of the shaft 6 cyclicly in such a manner that, with each revolution of the shaft 6 a new component 18 is freed to slide down, by gravity, into position between the clamping plates 13a and 13b.

The feed and separating mechanisms per se are not described in detail as such mechanisms are known and any such known mechanism may be used in connection with the present invention. A drive mechanism as shown however is considered to be within the scope of the present invention wherein the single cam shaft of the present apparatus is also employed to operate the feed and separating mechanisms.

OPERATION

Figure 1A:
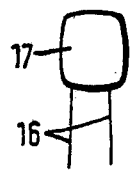
FIG. 1a shows a component with two contact leads still unworked.
Figure 1B:
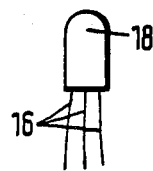
FIG. 1b shows a component with three contact leads still unworked.
Figure 2B:
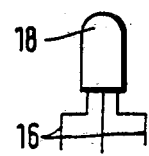
FIG. 2b shows a component with three contact leads already worked.

Electronic components such as shown in FIG. 1a and FIG. 1b are supplied to the apparatus by feeding mechanisms such as those shown schematically in FIG. 3a and FIG. 3b. A component is placed into the apparatus and held with its contact leads engaged by clamping plates 13a and 13b of tools 1a, 1b which are forced toward each other by the respective cam surfaces of the cam wheels 4 and 5. Tools 2a and 2b are then forced toward each other by the associated cam surfaces of the same cam wheels 4 and 5 so as to bend the contact leads to a desired shape while the contact leads remain held in engagement by the clamping plates 13a and 13b. Finally, cutting tool 3 is moved by the cam wheel 5 to cut the contact leads to the desired length. Tool 3 has a cutting edge at its front and uses the underside of bending tool 14a as the opposite cutting edge. All this happens during one rotation of the cam wheels 4 and 5 and the shaft 6. At the same time, other cams 9, 10, 11 on the shaft base are utilized to provide a new component which is introduced into the apparatus after the treated component has been removed.

What is claimed is:

1. Apparatus for forming, shaping and cutting of contact leads of electronic components, which contact leads extend from said components, said apparatus comprising: a support frame; axially spaced synchronous cam wheels mounted opposite each other on a common shaft and having cam surfaces at their side faces facing each other and being rotatably mounted on said support frame; a plurality of tools each being slidably supported by said frame between said cam wheels so as to be operated thereby, said slidably supported tools being biased into engagement with the cam surfaces of the respective cam wheels; said cam wheels being adapted to provide, upon rotation with said shaft, for timed operation of said slidably supported tools as they are forced by the associated cam surfaces to their working positions for the forming, shaping and cutting of said contact leads; means disposed between, and operated by, said cam wheels for engaging said electronic components in said apparatus with said leads extending therefrom in a predetermined manner and feed means for supplying said components to said apparatus, said feed means being operated synchronously with said cam wheels for cyclic operation of said feed means with said tools.

2. Apparatus as recited in claim 1, wherein, said shaft carries additional cams for operating said feed means.

3. Apparatus as recited in claim 2, wherein said feed means includes a trough having associated therewith a component separating device operated by said additional cams.

4. Apparatus as recited in claim 2, wherein said feed means includes a trough connected to a grasping mechanism cyclicly operated by said additional cams.

5. Apparatus as recited in claim 2, wherein said feed means is a component carrying belt cyclicly operated by said additional cams.

* * * * *